United States Patent
Mori et al.

(10) Patent No.: US 7,981,811 B2
(45) Date of Patent: Jul. 19, 2011

(54) SEMICONDUCTOR DEVICE AND METHOD FOR MANUFACTURING SAME

(75) Inventors: Shigeru Mori, Tokyo (JP); Takahiro Korenari, Tokyo (JP); Tadahiro Matsuzaki, Tokyo (JP); Hiroshi Tanabe, Tokyo (JP)

(73) Assignees: NEC Corporation, Tokyo (JP); NEC LCD Technologies, Ltd, Kanagawa (JP)

( * ) Notice: Subject to any disclaimer, the term of this patent is extended or adjusted under 35 U.S.C. 154(b) by 187 days.

(21) Appl. No.: 12/508,888

(22) Filed: Jul. 24, 2009

(65) Prior Publication Data

US 2009/0286374 A1 Nov. 19, 2009

Related U.S. Application Data

(62) Division of application No. 11/483,561, filed on Jul. 11, 2006, now Pat. No. 7,582,933.

(30) Foreign Application Priority Data

Jul. 12, 2005 (JP) ................................. 2005-202693

(51) Int. Cl.
 *H01L 21/31* (2006.01)
(52) U.S. Cl. ........ 438/778; 438/151; 438/301; 438/585; 438/783
(58) Field of Classification Search .................. 438/149, 438/151, 164, 299, 301, 585, 778, 783, 787
See application file for complete search history.

(56) References Cited

U.S. PATENT DOCUMENTS

| | | | |
|---|---|---|---|
| 5,187,551 A | 2/1993 | Shoji et al. | |
| 6,396,077 B1 | 5/2002 | Kubota et al. | |
| 6,461,907 B2 * | 10/2002 | Imai | 438/151 |
| 6,818,496 B2 * | 11/2004 | Dennison et al. | 438/149 |
| 7,374,981 B2 * | 5/2008 | Yamaguchi et al. | 438/149 |
| 2004/0132293 A1* | 7/2004 | Takayama et al. | 438/689 |
| 2005/0012151 A1 | 1/2005 | Yamaguchi et al. | |

FOREIGN PATENT DOCUMENTS

| | | |
|---|---|---|
| JP | 10-27911 A | 1/1998 |
| JP | 3177360 A | 4/2001 |
| JP | 2004140407 A | 5/2004 |

* cited by examiner

*Primary Examiner* — Kevin M Picardat
(74) *Attorney, Agent, or Firm* — Sughrue Mion, PLLC (57) ABSTRACT

A base layer is formed on an insulating substrate, and a semiconductor layer is formed in localized fashion thereon. A gate insulating film is then formed so as to cover the semiconductor layer, and a gate electrode is formed on a portion of the gate insulating film. An impurity is then implanted into the semiconductor layer via the gate insulating film, and a source region, a drain region, and an LDD region are formed. The gate insulating film is etched with dilute hydrofluoric acid. An electrode-protecting insulating film is then formed so as to cover the gate electrode, and the entire surface of the surface layer portion of the electrode-protecting insulating film is etched away using dilute hydrofluoric acid. Carrier traps introduced into the electrode-protecting insulating film and the gate insulating film are thereby removed.

28 Claims, 6 Drawing Sheets

HEAT TREATMENT

FIG. 4B

HYDROGEN PLASMA TREATMENT

SEMICONDUCTOR DEVICE AND METHOD FOR MANUFACTURING SAME

This application is a divisional application of U.S. application Ser. No. 11/483,561 filed Jul. 11, 2006 which claims priority based on Japanese Patent Application No. 2005-202693 filed Jul. 12, 2005, respectively. The entire disclosures of the prior applications are hereby incorporated by reference.

BACKGROUND OF THE INVENTION

1. Field of the Invention

The present invention relates to a semiconductor device provided with a thin-film transistor, and to a method for manufacturing the same.

2. Description of the Related Art

Semiconductor devices in which a thin-film transistor (Thin Film Transistor: also referred to hereinafter as TFT) is formed on a glass substrate or other insulating substrate are widely known as devices for driving active-matrix-type liquid crystal flat-panel displays, for example. Recent miniaturization and addition of multifunction capability to such semiconductor devices has necessitated TFTs having high durability and reliability.

A TFT has therefore been developed that is provided with a low-concentration drain region (Lightly Doped Drain: also referred to hereinafter as LDD region) in order to achieve high durability and reliability in a TFT. However, when a TFT provided with this type of LDD structure is manufactured, impurity ions are implanted into a semiconductor layer over a gate insulating film using the gate electrode as the mask after the gate insulating film and gate electrode are formed on the semiconductor layer. The gate insulating film therefore degrades due to the passage of the impurity ions, and it is sometimes impossible to ensure adequate reliability even when an LDD region is provided. These effects are thought to result from the formation of an element (carrier trap) that captures a carrier inside the gate insulating film through which ions have passed.

The gate insulating film in a TFT is usually left on the entire surface of the substrate without being patterned. This is done in order to maintain insulating properties between a semiconductor layer patterned as islands and the layer formed thereon. The ions implanted when the LDD region is formed are therefore implanted into a portion that protrudes from the area directly under the gate electrode in the gate insulating film. The gate insulating film in this portion is therefore damaged, and its characteristics are adversely affected. A hydrogen plasma treatment is performed on the semiconductor layer as needed, but the gate insulating film is also damaged by the hydrogen plasma treatment, and its characteristics are adversely affected. The characteristics of the gate insulating film are also compromised by contamination with metal.

Furthermore, the gate insulating film is usually formed by plasma CVD (Chemical Vapor Deposition) or sputtering when a TFT is formed on a glass substrate, but a fixed charge is easily introduced into the gate insulating film in these methods. This fixed charge in the gate insulating film affects the impurity concentration of the LDD and alters the characteristics of the TFT.

A technique is disclosed in Japanese Patent No. 3177360 whereby the portion that protrudes from the area directly under the gate electrode in the gate insulating film is removed partway in the film thickness direction after the gate electrode is formed. According to the abovementioned publication, the portion of the gate insulating film that is damaged by ion implantation can thereby be removed.

A technique is also disclosed in Japanese Laid-open Patent Application No. 10-27911 whereby a base insulating film, a gate insulating film, or another insulating film is formed on an insulating substrate, after which the insulating film is immersed in an electrolyte solution. According to Japanese Laid-open Patent Application No. 10-27911, fixed charges in the insulating film can thereby be removed, and the electrical characteristics of the TFT can be improved.

However, the conventional techniques described above have such problems as those described below. The TFT characteristics cannot be adequately stabilized merely by removing the portion of the gate insulating film that protrudes from the area directly under the gate electrode partway in the film thickness direction as described in Japanese Patent No. 3177360. The stabilizing effects on the characteristics of the TFT are also inadequate even when the base insulating film, gate insulating film, or other insulating film is immersed in an electrolyte solution as described in Japanese Laid-open Patent Application No. 10-27911.

SUMMARY OF THE INVENTION

An object of the present invention is to provide a semiconductor device in which the TFT characteristics are adequately stabilized, and to provide a method for manufacturing the same.

The semiconductor device according to the present invention comprises a substrate, a semiconductor layer formed in localized fashion on the substrate, a gate insulating film formed on the semiconductor layer, a gate electrode formed in a portion of the area directly above the semiconductor layer on the gate insulating film, and an electrode-protecting insulating film formed on the gate insulating film and the gate electrode, wherein the surface layer portion of the electrode-protecting insulating film is etched away after the electrode-protecting insulating film is formed.

In the present invention, the surface layer portion of the electrode-protecting insulating film is etched away after the electrode-protecting insulating film is formed. Carrier traps introduced into the electrode-protecting insulating film in the process of manufacturing the semiconductor device are thereby removed. The characteristics of a TFT provided with the semiconductor device, a gate insulating film, and a gate electrode are thereby stabilized.

The film thickness of the portion other than the area directly under the gate electrode in the gate insulating film is preferably smaller than the film thickness of the portion positioned in the area directly under the gate electrode. Carrier traps introduced into the gate insulating film in the process of manufacturing the semiconductor device are thereby removed, and the characteristics of the TFT are further stabilized.

The semiconductor device according to another aspect of the present invention comprises a substrate, a semiconductor layer formed in localized fashion on the substrate, a gate insulating film formed on the semiconductor layer, a gate electrode formed in a portion of the area directly above the semiconductor layer on the gate insulating film, and an electrode-protecting insulating film formed on the gate insulating film and the gate electrode, wherein the concentration of metal in the interface between the gate insulating film and the electrode-protecting insulating film is $1 \times 10^{11}$ atoms/cm$^2$ or less.

The semiconductor device according to yet another aspect of the present invention comprises a substrate, a semiconductor layer formed in localized fashion on the substrate, a gate insulating film formed on the semiconductor layer, and a gate electrode formed in a portion of the area directly above the semiconductor layer on the gate insulating film, wherein a source region, a drain region, and an LDD region are formed in the semiconductor layer, and the ratio ($Dtr/C_{LDD}$) has a value of 0.4 or less, where Dtr is the surface density of carrier traps in the area directly above the LDD region of the gate insulating film, and $C_{LDD}$ is the volumetric concentration of carriers in the LDD region.

The method for manufacturing a semiconductor device according to the present invention comprises forming a semiconductor layer in localized fashion on a substrate, forming a gate insulating film on the semiconductor layer, forming a gate electrode in a portion of the area directly above the semiconductor layer on the gate insulating film, forming an electrode-protecting insulating film on the gate insulating film and the gate electrode, terminating the semiconductor layer, and washing the electrode-protecting insulating film with a washing solution capable of etching the electrode-protecting insulating film to etch away the surface layer portion of the electrode-protecting insulating film.

In the present invention, by etching away the surface layer portion of the electrode-protecting insulating film after forming the electrode-protecting insulating film, carrier traps introduced into the electrode-protecting insulating film in the termination treatment step can be removed. The characteristics of the TFT composed of the semiconductor layer, the gate insulating film, and the gate electrode can thereby be stabilized.

The step for forming the gate electrode is preferably followed by a step for introducing an impurity into the semiconductor layer, and a step for washing the gate insulating film with a washing solution capable of etching the gate insulating film. The gate insulating film is thereby washed with a washing solution capable of etching the gate insulating film, and the top surface of the gate insulating film is etched. Carrier traps introduced into the gate insulating film by implantation of an impurity can thereby be removed. As a result, the characteristics of the TFT can be stabilized even further.

In the washing step performed at this time, washing is preferably performed until the value of the ratio (B/A) is from 0.01 to 0.65, where A is the film thickness of the portion positioned in the area directly under the gate electrode in the gate insulating film, and B is the difference between the film thickness of the portion positioned in the area directly under the gate electrode and the film thickness of the portion other than the area directly under the gate electrode. Carrier traps can thereby be removed from the gate insulating film without causing a void to form in the area directly under the gate electrode.

Alternatively, washing is preferably performed in the washing step until the concentration of metal on the surface of the gate insulating film is $1 \times 10^{11}$ atoms/cm$^2$ or less. Carrier traps caused by metal deposited on the gate insulating film can thereby be removed.

Alternatively, the step for implanting an impurity into the semiconductor layer involves forming a source region, a drain region, and an LDD region in the semiconductor layer, and washing is preferably performed in the washing step until the ratio ($Dtr/C_{LDD}$) has a value of 0.4 or less, where Dtr is the surface density of carrier traps in the area directly above the LDD region of the gate insulating film, and $C_{LDD}$ is the volumetric concentration of carriers in the LDD region. The carrier trap surface density with respect to the carrier concentration can thereby be minimized, and the effect of trapped carriers towards weakening the electric field of the LDD region can be reduced.

The method for manufacturing a semiconductor device according to another aspect of the present invention comprises forming a semiconductor layer in localized fashion on a substrate, forming a gate insulating film on the semiconductor layer, forming a gate electrode in a portion of the area directly above the semiconductor layer on the gate insulating film, implanting an impurity into the semiconductor layer, washing the gate insulating film with a washing solution capable of etching the gate insulating film, and forming an electrode-protecting insulating film on the gate insulating film and the gate electrode, wherein washing is performed in the washing step until the concentration of metal on the surface of the gate insulating film is $1 \times 10^{11}$ atoms/cm$^2$ or less.

The method for manufacturing a semiconductor device according to yet another aspect of the present invention comprises forming a semiconductor layer in localized fashion on a substrate, forming a gate insulating film on the semiconductor layer, forming a gate electrode in a portion of the area directly above the semiconductor layer on the gate insulating film, implanting an impurity into the semiconductor layer to form a source region, a drain region, and an LDD region in the semiconductor layer, and washing the gate insulating film with a washing solution capable of etching the gate insulating film, wherein washing is performed in the washing step until the ratio ($Dtr/C_{LDD}$) has a value of 0.4 or less, where Dtr is the surface density of carrier traps in the area directly above the LDD region of the gate insulating film, and $C_{LDD}$ is the volumetric concentration of carriers in the LDD region.

According to the present invention, a TFT having few carrier traps can be obtained, and a highly reliable semiconductor device having adequately stabilized TFT characteristics can be obtained.

DESCRIPTION OF THE PREFERRED EMBODIMENTS

Figure 1:
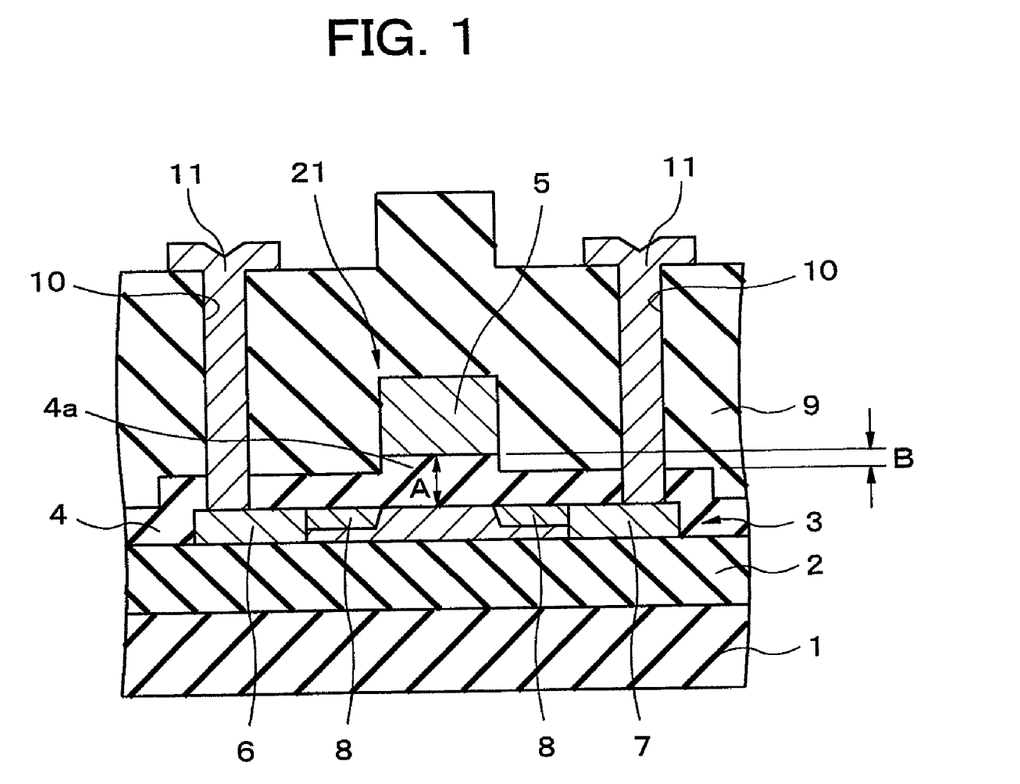
FIG. 1 is a sectional view showing the semiconductor device according to a first embodiment of the present invention.

Embodiments of the present invention will be described in detail hereinafter with reference to the accompanying drawings. A first embodiment of the present invention will first be described. FIG. 1 is a sectional view showing the semiconductor device according to the present embodiment. In the semiconductor device according to the present embodiment as shown in FIG. 1, an insulating substrate 1 composed of glass or the like is provided, and a base layer 2 that has a thickness of 100 to 1000 nm, for example, and is composed of a silicon oxide film, a silicon nitride film, or a laminate film thereof is formed over the entire surface of the insulating substrate 1. A plurality of TFT 21 are provided on the base layer 2. The base layer 2 prevents alkali metals and the like included in the insulating substrate 1 from diffusing into the TFT 21.

The constitution of the TFT 21 will be described hereinafter. A semiconductor layer 3 patterned in the shape of an island is provided in localized fashion on the base layer 2. The semiconductor layer 3 is composed of amorphous silicon, for example, and has a thickness of 30 to 100 nm, for example. A trace quantity of boron, phosphorus, or another impurity is introduced into the semiconductor layer 3 for the purpose of controlling the threshold value of the TFT 21. The semiconductor layer 3 may be formed from crystallized silicon that has characteristics that are superior to those of amorphous silicon. A high concentration of an impurity is implanted into both end portions of the semiconductor layer 3, a source region 6 is formed in one end portion, and a drain region 7 is formed in the other end portion. The upper portion of the region adjacent to the source region 6, and the upper portion of the region adjacent to the drain region 7 in the semiconductor layer 3 are LDD regions 8 in which an impurity is implanted at a lower concentration than in the source region 6 and the drain region 7. The region between the LDD regions 8 is a channel region. Specifically, the source region 6, an LDD region 8, the channel region, an LDD region 8 and the drain region 7 are arranged in a row in this sequence in the semiconductor layer 3.

A gate insulating film 4 is formed over the entire surface of the base layer 2 so as to cover the semiconductor layer 3. The gate insulating film 4 is composed of a silicon oxide film, a silicon nitride film, or a laminate film thereof, and is formed to a thickness of 50 to 300 nm, for example. A convex portion 4a that protrudes upward with from the surrounding area is formed in the area directly above the channel region of the semiconductor layer 3 on the upper surface of the gate insulating film 4. The film thickness of the portion other than the convex portion 4a of the gate insulating film 4 is reduced by etching, and is less than the film thickness of the convex portion 4a. The ratio (B/A) is 0.01 to 0.65, where A is the film thickness of the convex portion 4a, and B is the difference between the film thickness of the convex portion 4a and the film thickness of the portion other than the convex portion 4a. The value of this ratio (B/A) when indicated as a percentage is the thickness reduction ratio during etching of the gate insulating film 4. Specifically, the thickness reduction ratio is 1 to 65% in the present embodiment. This thickness reduction ratio is equivalent to the ratio of the depth (B) to which the portion of the gate insulating film that protrudes from the gate electrode is bored with respect to the thickness (A) of the gate insulating film positioned in the area directly under the gate electrode.

Furthermore, a gate electrode 5 is formed in the area directly above the convex portion 4a of the gate insulating film 4. The gate electrode 5 is composed of metal or silicon into which an impurity is introduced, and has a film thickness of 50 to 1000 nm, for example. An electrode-protecting insulating film 9 is provided over the entire surface of the gate insulating film 4 so as to cover the gate electrode 5. The electrode-protecting insulating film 9 is composed of a silicon oxide film, a silicon nitride film, or a laminate film thereof, and is formed to a thickness of 10 to 500 nm, for example. The entire surface of the surface layer portion of the electrode-protecting insulating film 9 is removed by etching after the electrode-protecting insulating film 9 is formed.

Contact holes 10 that reach the source region 6, the drain region 7, and the gate electrode 5 are formed in the areas directly above the source region 6, the drain region 7, and the gate electrode 5, respectively, in the gate insulating film 4 and the electrode-protecting insulating film 9. An electrode film 11 is formed inside the contact holes 10 and in the regions that include the areas directly above the contact holes 10 on the electrode-protecting insulating film 9, and is connected to the source region 6, the drain region 7, or the gate electrode 5. In FIG. 1, the electrode film 11 that is connected to the gate electrode 5 is omitted from the drawing for convenience. The semiconductor layer 3, gate insulating film 4, gate electrode 5, electrode-protecting insulating film 9, contact holes 10, and electrode film 11 constitute the TFT 21.

The electrode-protecting insulating film 9 maintains insulating properties between the gate electrode 5 and the electrode film 11, and prevents the gate electrode 5 from separating from the gate insulating film 4 when heat treatment is performed to activate the impurity that is introduced into the source region 6, the drain region 7, and the LDD regions 8 in the process of manufacturing this semiconductor device. Depending on the intended application of the TFT 21, other electrode films, passivation films, interlayer insulating films, planarizing films, capacitance insulating films, and the like (none of which are shown in the drawing) are formed as appropriate above the electrode-protecting insulating film 9 and the electrode film 11.

The operation of the present embodiment will next be described. In the manufacturing process of the semiconductor device according to the present embodiment, a metal or the like is introduced into the gate insulating film 4 when the gate electrode 5 is formed, and carrier traps are introduced into the gate insulating film 4 by the occurrence of damage in the gate insulating film 4 during implantation of an impurity into the semiconductor layer 3. These carrier traps are concentrated in the surface layer of the gate insulating film 4. However, in the present embodiment, since the surface layer of the gate insulating film 4 is removed by etching, these carrier traps are also removed. The thickness reduction ratio of the gate insulating film 4 at this time is 1 to 65%. There is therefore no occurrence of voids in the area directly under the gate electrode 5, and the good electric characteristics of the gate insulating film 4 can be maintained.

In the manufacturing process of the semiconductor device, carrier traps are introduced into the electrode-protecting insulating film 9 when heat treatment is performed to activate the impurity implanted into the semiconductor layer 3, and when hydrogen plasma treatment is performed to terminate the semiconductor layer 3. These carrier traps are concentrated in the surface layer of the electrode-protecting insulating film 9. However, in the present embodiment, these carrier traps are removed because the electrode-protecting insulating film 9 is etched and the surface layer thereof is removed. Since the carrier traps are thus removed from the gate insulating film 4 and the electrode-protecting insulating film 9 in the semiconductor device according to the present embodiment, there is little trapping of carriers in the carrier traps even when a bias stress is applied to the TFT 21, and fluctuation of the threshold voltage can be suppressed.

According to the present embodiment thus configured, fluctuation of the threshold voltage of the TFT during application of a bias stress can be suppressed and the characteristics of the TFT can be stabilized by effectively removing carrier traps that are unavoidably introduced into the semiconductor device in the process of manufacturing the TFT. A semiconductor device provided with a highly reliable TFT can thereby be obtained.

A second embodiment of the present invention will next be described. The semiconductor device according to the present embodiment differs from the semiconductor device according to the aforementioned first embodiment in that the metal concentration at the interface between the gate insulating film 4 and the electrode-protecting insulating film 9 is $1.0 \times 10^{11}$ atoms/cm$^2$ or less. The upper surface of the portion other than the convex portion 4a in the gate insulating film 4 is also etched with a washing solution capable of etching the gate insulating film 4 in the present embodiment, in the same manner as in the aforementioned first embodiment. However, the thickness reduction ratio thereof is not necessarily limited to the range of 1 to 65%, and it is sufficient if etching is performed so that the metal concentration at the interface with the electrode-protecting insulating film 9 is within the range described above. Aspects of the configuration other than those described above in reference to the present embodiment are the same as in the previously described first embodiment.

The operation of the present embodiment will next be described. In the manufacturing process of the semiconductor device according to the present embodiment, a conducting film is formed by sputtering or CVD, and this conducting film is etched away, whereby a gate electrode 5 is formed. At this time, the metal constituting the inner wall of the chamber in which sputtering, CVD, or etching is performed is deposited on the gate insulating film 4. This metal also remains in the interface between the gate insulating film 4 and the electrode-protecting insulating film 9 after the TFT is formed, and acts as a carrier trap. This metal is one or more types of metal selected from the group consisting of Al, Cr, Mo, W, Nb, Ta, and Nd, for example.

In contrast, in the present embodiment, after the gate electrode 5 is formed, the upper surface of the gate insulating film 4 is etched with a washing solution, and the metal deposited on the gate insulating film 4 is removed. As a result, the metal concentration in the interface between the gate insulating film 4 and the electrode-protecting insulating film 9 becomes $1.0 \times 10^{11}$ atoms/cm$^2$ or less. Carrier traps are thereby reduced, and the characteristics of the TFT are stabilized. As described above, by etching the gate insulating film 4 after forming the gate electrode 5, it is possible to allow the area directly under the gate electrode 5 in the gate insulating film 4 to remain unetched, and a convex portion 4a to be formed. Operations and effects other than those described above in reference to the present embodiment are the same as in the previously described first embodiment.

A third embodiment of the present invention will next be described. The semiconductor device according to the present embodiment differs from the semiconductor device according to the aforementioned first embodiment in that the ratio ($Dtr/C_{LDD}$) has a value of 0.4 or less, where Dtr is the surface density of carrier traps in the portions corresponding to the areas directly above the LDD regions 8 of the gate insulating film 4, and $C_{LDD}$, the volumetric concentration of the impurity in the LDD regions 8. The term "trap surface density" refers to the value obtained when the sum of the cross-sectional area of the carrier traps in the portions that correspond to the areas directly above the LDD regions 8 of the gate insulating film 4 is divided by the surface area of the interface between the aforementioned portions and the semiconductor layer 3. The upper surface of the portion other than the convex portion 4a in the gate insulating film 4 is also etched in the present embodiment, in the same manner as in the aforementioned first embodiment. However, the thickness reduction ratio thereof is not necessarily limited to the range of 1 to 65%. Aspects of the configuration other than those described above in reference to the present embodiment are the same as in the previously described first embodiment.

In the present embodiment, bringing the value of the aforementioned ratio ($Dtr/C_{LDD}$) to 0.4 or less allows the carriers to become less easily trapped in the LDD regions 8, and the threshold voltage of the TFT to be less prone to fluctuate. Operations and effects other than those described above in reference to the present embodiment are the same as in the previously described first embodiment.

A fourth embodiment of the present invention will next be described. The present embodiment is an embodiment of the method for manufacturing the semiconductor device according to the previously described first embodiment. FIGS. 2A through 2D, 3A through 3C, 4A and 4B, and 5A and 5B are sectional views showing the sequence of steps in the method for manufacturing a semiconductor device according to the present embodiment.

Figure 2A:
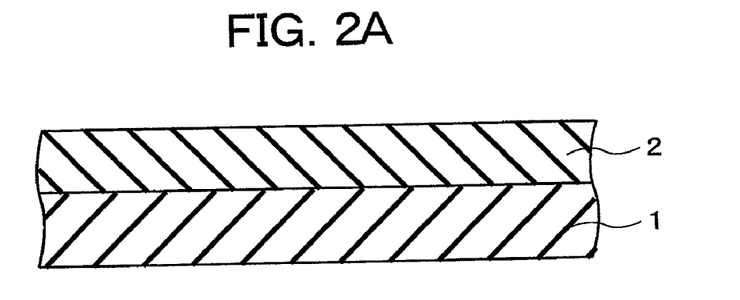
FIGS. 2A through 2D are sectional views showing the sequence of steps in the method for manufacturing a semiconductor device according to a fourth embodiment of the present invention.

First, as shown in FIG. 2A, a base layer 2 is formed by forming a silicon oxide film, a silicon nitride film, or a laminate film thereof to a thickness of 100 to 1000 nm, for example, on an insulating substrate 1 composed of glass or the like by CVD (Chemical Vapor Deposition). This base layer 2 prevents the heat treatment performed in a subsequent step from causing alkali metals and the like included in the insulating substrate 1 to diffuse into the TFT 21 (see FIG. 1) formed on the base layer 2.

Figure 2B:
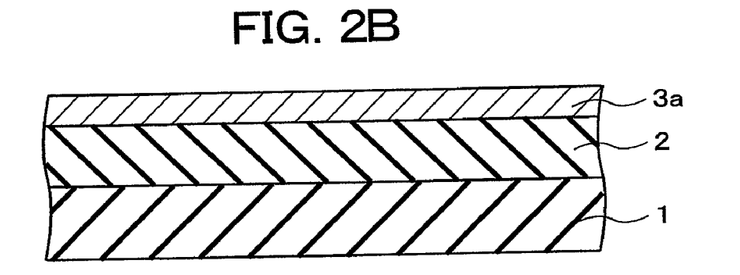

An amorphous silicon layer 3a having a thickness of 30 to 100 nm, for example, is then formed by CVD over the entire surface of this base layer 2, as shown in FIG. 2B. The base layer 2 and the amorphous silicon layer 3a are preferably formed continuously using the same plasma CVD device at this time in order to shorten the production time. Specifically, the amorphous silicon layer 3a is preferably formed immediately after the base layer 2 is formed, without the base layer 2 being exposed to the atmosphere. A trace quantity of boron, phosphorus, or another impurity is implanted for the purpose of controlling the threshold value of the TFT 21. The impurity is implanted during or after formation of the amorphous silicon layer 3a. Depending on the intended application of the TFT thus formed, a crystallized silicon layer that has superior characteristics may be formed instead of the amorphous silicon layer 3a. The crystallized silicon layer is formed by a CVD method or by forming an amorphous silicon layer as a precursor and then crystallizing this amorphous silicon layer by irradiation with an excimer laser or the like.

Figure 2C:
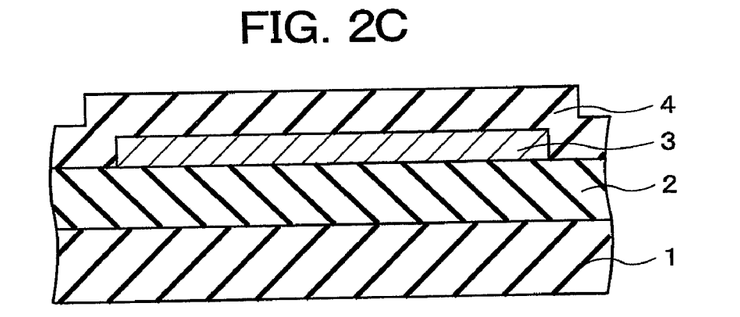

As shown in FIG. 2C, performing lithography and dry etching on the amorphous silicon layer 3a (see FIG. 2B) allows the amorphous silicon layer 3a to be patterned in the desired shape, and a semiconductor layer 3 to be formed. A silicon oxide film, a silicon nitride film, or a laminate of the two having a thickness of 50 to 300 nm, for example, is then formed over the entire surface of the base layer 2 by any of the methods that include CVD, PVD (Physical Vapor Deposition), plasma oxidation, and oxidation by water vapor under high pressure. This process is performed at a lower temperature than the one that causes significant deformation of the insulating substrate 1 and may be performed at a temperature of 600° C. or lower, for example. A gate insulating film 4 is thereby formed so as to cover the semiconductor layer 3.

Figure 2D:
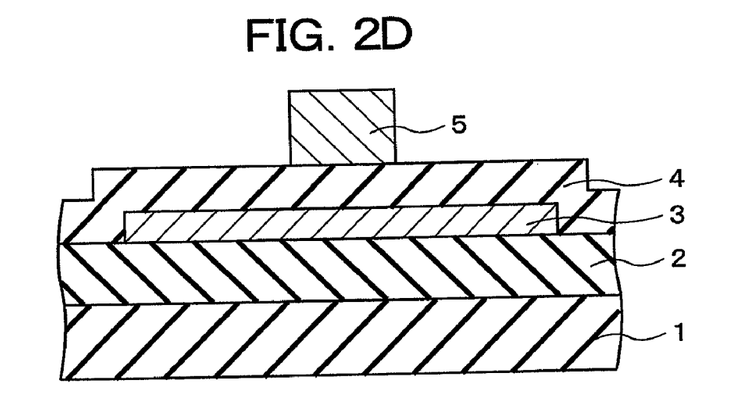

A metal film is then formed by sputtering, an impurity-containing silicon film is formed by CVD or the like, or a laminate film composed of the aforementioned films is formed over the entire surface of the gate insulating film 4, whereby a conducting film is formed to a thickness of 50 to 1000 nm, for example, as shown in FIG. 2D. The impurity added to the aforementioned silicon film is boron or phosphorus, for example, and the type thereof differs according to the intended application of the TFT thus formed. A resist pattern (not shown in this or subsequent drawings) is then formed on this conducting film, the conducting film is etched and patterned using this resist pattern as a mask, and a gate electrode 5 is formed. Dry etching, wet etching, or a combination of both is used at this time as the etching method. This resist pattern is then removed. A metal is introduced into the gate insulating film 4 during formation of this gate electrode 5 to generate carrier-trapping elements, i.e., carrier traps.

Figure 3A:
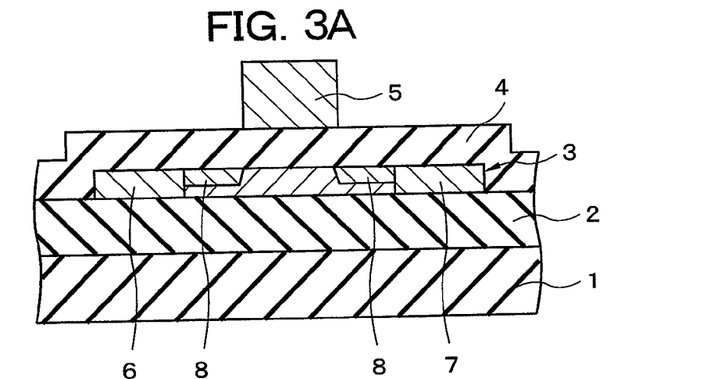
FIGS. 3A through 3C are sectional views showing the sequence of steps subsequent to the step shown in FIG. 2D in the method for manufacturing a semiconductor device according to the present embodiment.

A resist pattern is then formed on the gate insulating film 4; phosphorus, boron, or another impurity is implanted at a high concentration into the semiconductor layer 3 using this resist pattern as a mask; and a source region 6 and a drain region 7 are formed at the end portions of the semiconductor layer 3, as shown in FIG. 3A. The resist pattern is then peeled off The gate electrode 5 is then used as a mask to implant phosphorus, boron, or another impurity at a lower concentration than during formation of the source region 6 and drain region 7, and an LDD region 8 is formed in the upper portion of the region adjacent to the source region 6, and in the upper portion of the region adjacent to the drain region 7 in the semiconductor layer 3. The region between the LDD regions 8 in the semiconductor layer 3 becomes a channel region at this time. A configuration may also be adopted in which the LDD regions 8 are not formed, and the region between the source region 6 and drain region 7, on the one hand, and the area directly under the gate electrode 5, on the other hand, in the semiconductor layer 3 are used as offset regions.

In the step for implanting an impurity into this semiconductor layer 3, the bonds between silicon and oxygen or the bonds between silicon and nitrogen in the gate insulating film 4 are broken and carrier traps are generated when the impurity ions pass through the gate insulating film 4 composed of a silicon oxide film, a silicon nitride film, or a laminate film thereof Carrier traps are also generated by the introduction of a metal into the gate insulating film 4. The gate insulating film on the offset region is damaged by dry etching and/or wet etching during formation of the gate electrode even when an offset region is formed in the semiconductor layer 3 without forming the LDD regions 8; i.e., without implanting an impurity at a low concentration. Carrier traps are therefore generated in this instance as well.

The substrate provided with the elements that include the gate electrode 5 is then washed using functional water. The term "functional water" refers to hydrogenated water, ozonated water, carbonated water, and the like. The term "washing step in which functional water is used" is a generic reference to a washing step that uses hydrogenated water, a washing step that uses ozonated water, or a washing step that uses carbonated water, and this step is performed in order to remove a resist, a metal, and other impurities from a surface. It is particularly effective to wash the substrate with ozonated water subsequent to washing the substrate with hydrogenated water. When irradiation with ultraviolet rays is performed before washing using functional water, organic substances adhering to the surface can be decomposed, and the effects of washing using functional water can be enhanced. Furthermore, the substrate can be washed by being immersed into a tank containing functional water, but the use of a spin washing method in which functional water is dripped onto the gate insulating film while the substrate is rotated is preferred in order to evenly treat the entire surface of the substrate.

Figure 3B:
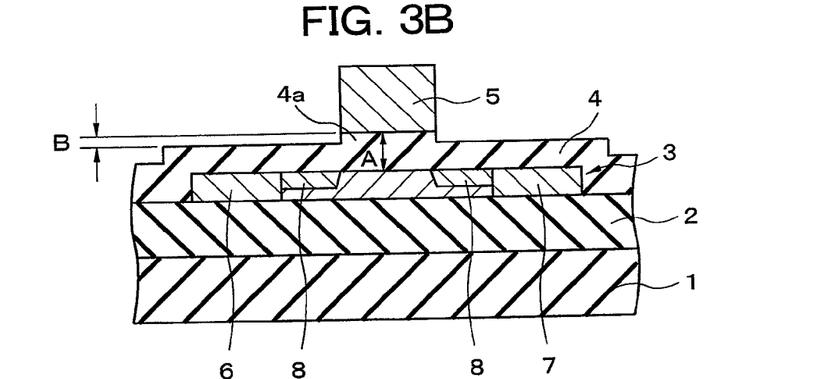

The substrate thus washed with functional water is then washed with a washing solution capable of etching the gate insulating film 4, and the surface of the gate insulating film 4 is etched, as shown in FIG. 3B. An aqueous solution containing hydrogen fluoride, for example, is used as the washing solution capable of etching the gate insulating film 4. Dilute hydrofluoric acid or buffered hydrofluoric acid (BHF) that contains ammonium fluoride, for example, is used. Washing the substrate in this manner makes it possible to remove the surface layer of the portion other than the area directly under the gate electrode 5 in the gate insulating film 4, and to remove the aforementioned carrier traps. As a result, the portion corresponding to the area directly under the gate electrode 5 in the upper layer of the gate insulating film 4 is allowed to remain unetched while the other portion is etched away, whereby a convex portion 4a is formed. At this time, the ratio (B/A) is 0.01 to 0.65, where B is the difference between the film thickness of the convex portion 4a and the film thickness of the portion other than the convex portion 4a, and A is the film thickness of the convex portion 4a; i.e., B is the film thickness removed by etching, and A is the thickness A of the unetched gate insulating film 4. Specifically, the thickness reduction ratio is 1 to 65%. The substrate can be washed by being immersed in a tank that contains the washing solution, but the use of a spin washing method in which the washing solution is dripped onto the gate insulating film 4 while the substrate is rotated is preferred in order to evenly treat the entire surface of the substrate.

Figure 3C:
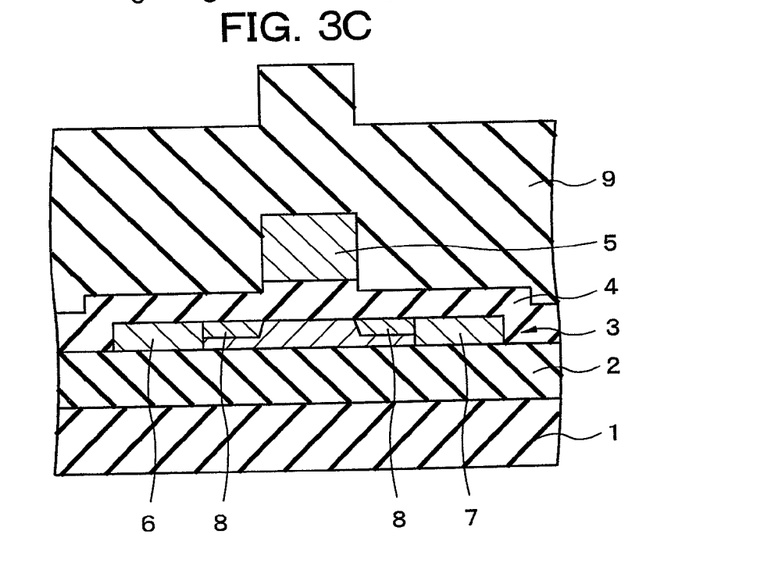

A silicon oxide film, a silicon nitride film, or a laminate film thereof having a thickness of 10 to 500 nm, for example, is then formed by CVD or the like, as shown in FIG. 3C. An electrode-protecting insulating film 9 is thereby formed on the gate insulating film 4 so as to cover the gate electrode 5.

Figure 4A:
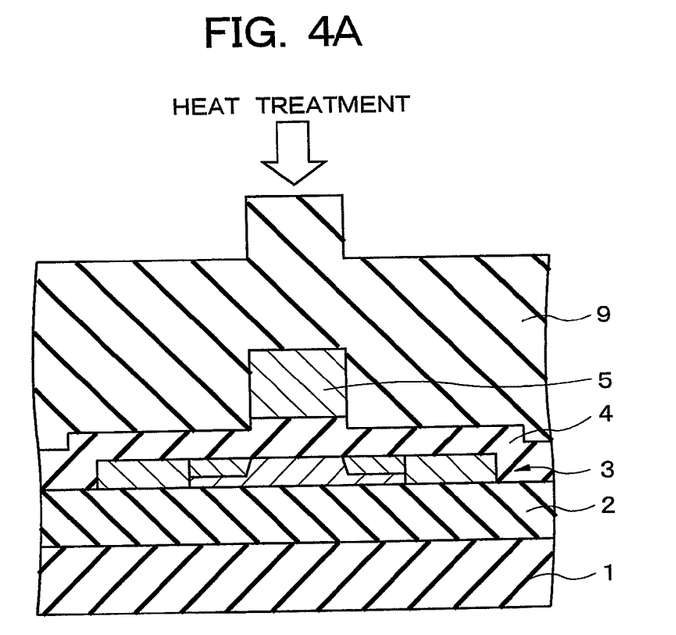
FIGS. 4A and 4B are sectional views showing the sequence of steps subsequent to the step shown in FIG. 3C in the method for manufacturing a semiconductor device according to the present embodiment.

The substrate provided with the elements that include the electrode-protecting insulating film 9 is then placed in an oven and heat-treated at 300 to 700° C., for example, as shown in FIG. 4A. The impurity introduced into the semiconductor layer 3 is thereby activated. At this time, the electrode-protecting insulating film 9 prevents the gate electrode 5 from separating from the gate insulating film 4. This heat treatment may be performed by irradiation with an excimer laser. Even in this case, separation of the gate electrode 5 can be prevented by the electrode-protecting insulating film 9, the same as when an oven is used.

Figure 4B:
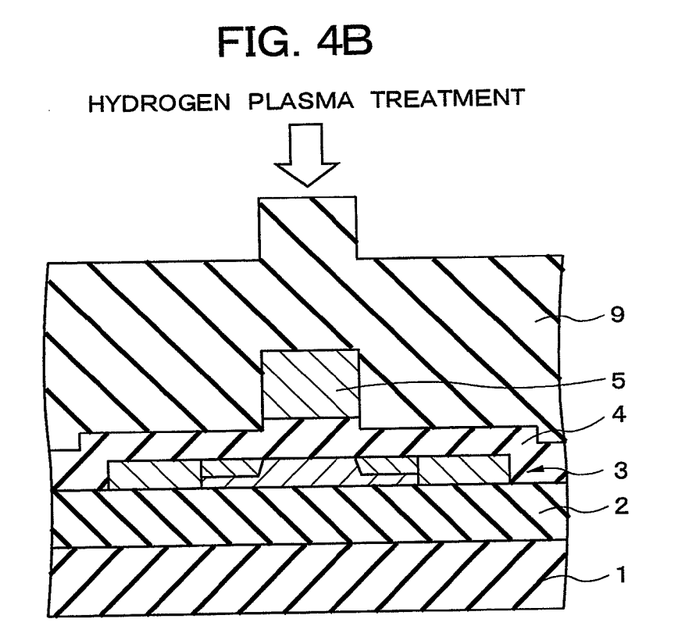

The heat-treated substrate is then treated using a hydrogen plasma in order to terminate the unterminated dangling bonds in the semiconductor layer 3, as shown in FIG. 4B. Degradation of the TFT electrical characteristics, such as reduced mobility, for example, occurs if these dangling bonds are not terminated. However, the electrode-protecting insulating film 9 is damaged by plasma from this treatment, and carrier traps that trap carriers are formed.

Figure 5A:
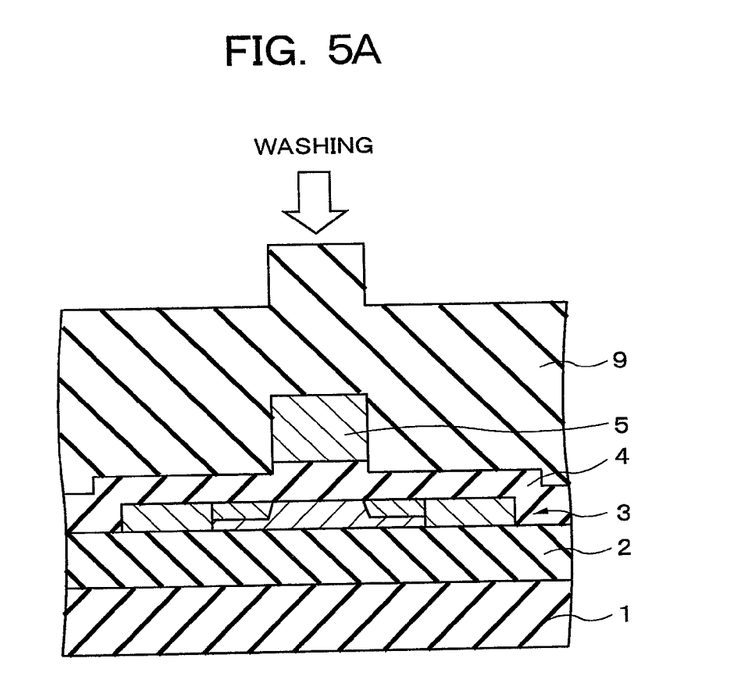
FIGS. 5A and 5B are sectional views showing the sequence of steps subsequent to the step shown in FIG. 4B in the method for manufacturing a semiconductor device according to the present embodiment.

The substrate is then washed with functional water, and residue adhering to the surface of the electrode-protecting insulating film 9 is removed, as shown in FIG. 5A. The substrate may be washed in this manner by being immersed into a tank containing functional water, but the use of a spin washing method in which functional water is dripped onto the electrode-protecting insulating film 9 while the substrate is rotated is preferred in order to evenly treat the entire surface of the substrate. The same as in the case of washing the aforementioned gate insulating film 4, it is more effective to wash the substrate with ozonated water subsequent to washing the substrate with hydrogenated water. Furthermore, when irradiation with ultraviolet rays is performed before washing using functional water, organic substances adhering to the surface can be decomposed, and the effects of washing using functional water can be even further enhanced.

This substrate is then washed in a washing solution capable of etching the electrode-protecting insulating film 9. Buffered hydrofluoric acid, for example, is used as this type of washing solution. The entire surface of the surface layer portion of the electrode-protecting insulating film 9 is etched by this washing. Carrier traps that occur in the electrode-protecting insulating film 9 can thereby be removed. The substrate can be washed by being immersed into a tank containing the washing solution, but the use of a spin washing method in which the washing solution is dripped onto the electrode-protecting insulating film 9 while the substrate is rotated is preferred in order to evenly treat the entire surface of the substrate.

Figure 5B:
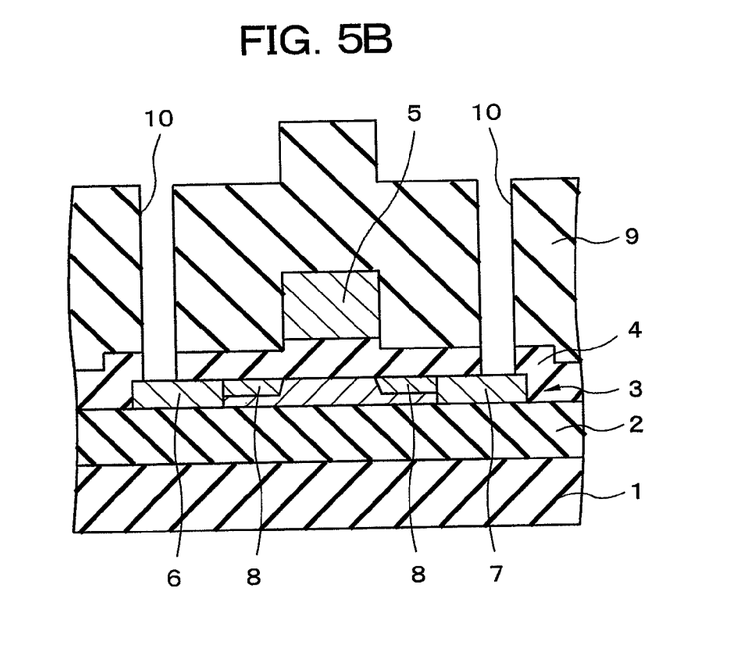

The electrode-protecting insulating film 9 and the gate insulating film 4 are then lithographed and etched, and contact holes 10 are formed in the area directly above the source region 6 and in the area directly above the drain region 7 in the electrode-protecting insulating film 9 and gate insulating film 4, as well as in the area directly above the gate electrode 5 in the electrode-protecting insulating film 9, as shown in FIG. 5B. The contact holes 10 are formed so as to reach the source region 6, the drain region 7, and the gate electrode 5. In FIG. 5B, the contact hole 10 positioned in the area directly above the gate electrode 5 is omitted from the drawing for convenience. Dry etching, wet etching, or a combination of both is used as the etching method.

A metal film is then formed by sputtering in the contact holes 10 and on the electrode-protecting insulating film 9. The metal film is then patterned to form an electrode film 11 connected to the source region 6, the drain region 7, and the gate electrode 5, as shown in FIG. 1. Insulating properties between the gate electrode 5 and the electrode film 11 can be maintained at this time by the electrode-protecting insulating film 9. A TFT 21 composed of the semiconductor layer 3, gate insulating film 4, gate electrode 5, electrode-protecting insulating film 9, and electrode film 11 is thereby formed. The metal film is patterned by lithography or etching. Dry etching, wet etching, or a combination of both is used as the etching method. Depending on the intended application of the TFT, other electrode films, passivation films, interlayer insulating films, planarizing films, capacitance insulating films, and the like are then formed as appropriate on the electrode film 11. The semiconductor device according to the previously described first embodiment can thereby be manufactured.

The reasons for the numerical limits in the conditions according to which the present invention is structured will next be described. Specifically, the reason for setting the thickness reduction ratio to 1 to 65% when the gate insulating film 4 is etched after implantation of impurity ions into the semiconductor layer 3 will next be described.

Figure 6:
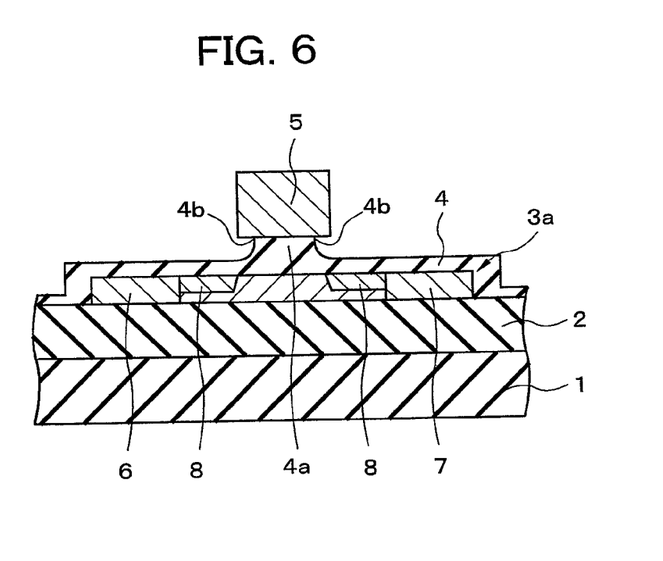
FIG. 6 is a sectional view showing the shape of the etched gate insulating film in the present embodiment.
Figure 7:
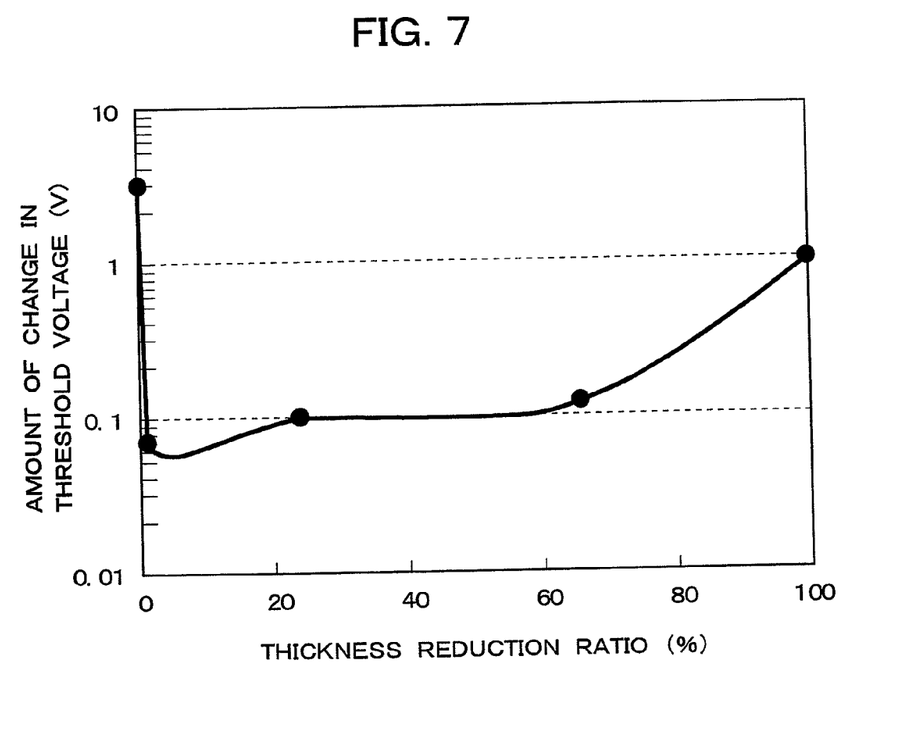
FIG. 7 is a graph showing the effect of the thickness reduction ratio on the TFT characteristics, wherein the thickness reduction ratio of the gate insulating film is plotted on the horizontal axis, and the amount of change in the threshold voltage of the TFT is plotted on the vertical axis.

FIG. 6 is a sectional view showing the shape of the etched gate insulating film; and FIG. 7 is a graph showing the effect of the thickness reduction ratio on the TFT characteristics, wherein the thickness reduction ratio of the gate insulating film is plotted on the horizontal axis, and the amount of change in the threshold voltage of the TFT is plotted on the vertical axis. As shown in FIG. 6, wet etching is used to etch the gate insulating film 4 when the film is washed with a washing solution capable of etching the film. Since this wet etching is an isotropic etching, the washing solution also enters the area directly under the gate electrode 5, and concave portions 4b are formed at the ends of the area directly under the gate electrode 5, i.e., on the sides of the convex portion 4a. If these concave portions 4b are small, the concave portions 4b can be filled back in when the electrode-protecting insulating film 9 is formed in a later step. However, when the concave portions 4b are large, it becomes difficult for the concave portions 4b to be filled in by the electrode-protecting insulating film 9. The portions that cannot be filled in by the electrode-protecting insulating film 9 in the concave portions 4b become voids, the dielectric strength of these portions decreases, and damage easily occurs when an electric field is applied.

FIG. 7 shows the amount of change $\Delta$Vth of the threshold voltage when the thickness reduction ratio for the gate insulating film 4 is varied in a plurality of P-channel TFTs in which the channel width is 4 µm, the channel length is 4 µm, and the width of the LDD regions is 1.2 µm. In each of the TFTs, the bias stress is applied for 100 hours while the drain/source voltage (Vds) is set to 0 V, and the gate/source voltage (Vgs) is set to +11 V. As shown in FIG. 7, when the thickness reduction ratio of the gate insulating film 4 is 0%, i.e., when the gate insulating film 4 is not etched, the threshold voltage of the TFT significantly fluctuates when a bias stress is applied. In contrast, when the thickness reduction ratio is 1% or higher, the fluctuation of the threshold voltage caused by the bias stress can be suppressed.

However, when the thickness reduction ratio exceeds 65%, the amount of change in the threshold voltage caused by the bias stress significantly increases compared to when the thickness reduction ratio is less than 65%. The reason for this is that the concave portions 4b increase in size as the thickness reduction ratio increases, which results in the formation of voids due to the inability of the electrode-protecting insulating film 9 to completely fill in the concave portions 4b, and the breakdown voltage of the gate insulating film is lowered. Therefore, the thickness reduction ratio of the gate insulating film is preferably 1 to 65%. As shown in FIG. 7, the effects whereby the change in threshold voltage due to bias stress is reduced become particularly significant when the thickness reduction ratio is set to 1 to 24%. Therefore, the thickness reduction ratio is more preferably set to 1 to 24%.

The operation of the present embodiment will next be described. In the present embodiment, a metal or the like is introduced into the gate insulating film 4 in the step for forming the gate electrode 5 shown in FIG. 2D, and carrier traps are introduced into the gate insulating film 4 by damage occurring in the gate insulating film 4 when an impurity is implanted into the semiconductor layer 3 shown in FIG. 3A. However, as shown in FIG. 3B, these carrier traps can be removed by etching the gate insulating film 4 and removing the surface layer thereof. This is because the carrier traps are concentrated in the surface layer of the gate insulating film. By setting the thickness reduction ratio of the gate insulating film 4 to from 1 to 65% at this time, a void can be prevented from forming in the area directly under the gate electrode 5, and the good electric characteristics of the gate insulating film 4 can be maintained.

Carrier traps are introduced into the electrode-protecting insulating film 9 by the impurity-activating heat treatment shown in FIG. 4A, and by the hydrogen plasma treatment performed to terminate the semiconductor layer, as shown in FIG. 4B. However, these carrier traps can be removed by etching the electrode-protecting insulating film 9 and removing the surface layer thereof, as shown in FIG. 5A. Removing the carrier traps from the gate insulating film 4 and the electrode-protecting insulating film 9 in this manner allows fewer carriers to be trapped by the carrier traps, and fluctuation of the threshold voltage to be reduced even when a bias stress is applied to the TFT 21.

A TFT for forming a multifunctional integrated circuit or the like is sometimes used in a state (biased state) in which a voltage is applied and maintained between the gate and the source, or between the gate and the drain. In such a case, the presence of carrier-trapping formations (carrier traps) in the gate insulating film on the LDD region causes carriers that flow into the gate insulating film during a biased state to be trapped by the carrier traps and accumulated in the gate insulating film. When carrier traps are present in the electrode-protecting insulating film, carriers accumulate in the electrode-protecting insulating film when a voltage is applied to a semiconductor device that is composed of the TFT. The electric field formed by these carriers accumulated in the gate insulating film and the electrode-protecting insulating film has an effect on the LDD regions, and this effect manifests itself in a change in the TFT over time, i.e., a change in the threshold voltage. Reasons for the formation of carrier traps in the gate insulating film on the LDD regions include the breaking of bonds between silicon and oxygen or bonds between silicon and nitrogen due to the implantation of impurity ions, the introduction of metals in the gate electrode formation step and the impurity implantation step, and other reasons.

In the present embodiment, surface residue is removed because the substrate is washed with functional water after the impurity is implanted as described above. Since the gate insulating film is then washed with a washing solution capable of etching the gate insulating film, the abovementioned carrier traps in the gate insulating film are removed.

Particularly in this washing step, setting the thickness reduction ratio of the gate insulating film to 1% or higher allows the layer in which the carrier traps generated in the impurity implantation step are present to be reliably removed. On the other hand, by making the thickness reduction ratio 65% or lower, voids can be prevented from forming, and the breakdown voltage of the gate insulating film isn't therefore lowered. By thus determining the range of the thickness reduction ratio, a highly reliable TFT can be formed in which there is little change over time of the TFT in a biased state.

The semiconductor layer is then heat-treated in order to activate the impurity in the semiconductor layer, after which hydrogen plasma treatment is performed to terminate the semiconductor layer. However, the surface area of contact between the gate insulating film and the gate electrode has been reduced by the recent miniaturization of semiconductor devices. According to the type of material used to form the electrode, the gate electrode also adheres less strongly to the gate insulating film when the gate electrode is heated. Therefore, an electrode-protecting insulating film for preventing the gate electrode from separating during an impurity-activating heat treatment must be formed before this impurity-activating heat treatment. The desorption temperature of terminated hydrogen is lower than the temperature during the impurity-activating heat treatment. Therefore, when an impurity-activating heat treatment is performed after a hydrogen plasma treatment, hydrogen is desorbed in the heat treatment step for activating the impurity, and the effects of the hydrogen plasma treatment are diminished. Therefore, the hydrogen plasma treatment must be performed at a later stage than the impurity-activating heat treatment. As a result, the hydrogen plasma treatment is necessarily performed after the electrode-protecting insulating film is formed, and the electrode-protecting insulating film is damaged by the hydrogen plasma. Carrier traps are thereby formed in the electrode-protecting insulating film.

Therefore, in the present embodiment, washing with functional water is performed after the hydrogen plasma treatment step, the residue is removed from the surface of the electrode-protecting insulating film, the electrode-protecting insulating film is then washed with a washing solution capable of etching the electrode-protecting insulating film, and the carrier traps are removed. Carriers are thereby less prone to accumulate in the electrode-protecting insulating film even in a biased state.

In the present embodiment, efficiently removing the carrier traps that are inevitably introduced into the semiconductor device in the process of manufacturing the TFT allows fluctuation of the TFT threshold voltage to be suppressed when a bias stress is applied, and the characteristics of the TFT to be stabilized. Degradation due to the bias stress is thereby suppressed, and it is possible to obtain a TFT that has adequate electric characteristics with respect to bias stress. As a result, a highly reliable semiconductor device can be obtained.

In contrast, as described in the previously mentioned Japanese Patent No. 3177360, the carrier traps introduced into the electrode-protecting insulating film by hydrogen plasma treatment cannot be removed merely by removing the gate insulating film partway in the film thickness direction and the TFT-stabilizing effects are inadequate. Even when the gate insulating film is immersed in an electrolyte solution prior to impurity implantation, the carrier traps introduced into the gate insulating film in the self-aligning impurity implantation step cannot be removed, and the carrier traps introduced into the electrode-protecting insulating film also cannot be removed, as described in Japanese Laid-open Patent Application No. 10-27911. The stabilization of the TFT characteristics is therefore inadequate.

An example was described in the present embodiment in which a hydrogen plasma treatment is performed after the electrode-protecting insulating film 9 is formed, but the electrode-protecting insulating film may also be formed in two stages before and after the hydrogen plasma treatment in order to shorten the time needed for the hydrogen plasma treatment. In this case, the electrode-protecting insulating film of the first stage must be formed before the impurity-activating heat treatment, and the thickness of the electrode-protecting insulating film formed at that time must be sufficient to prevent the gate electrode from separating during the impurity-activating heat treatment. After formation of the electrode-protecting insulating film of the first stage, the impurity-activating heat treatment and a hydrogen plasma treatment are performed, the electrode-protecting insulating film is washed with a washing fluid capable of etching the electrode-protecting insulating film, and then the electrode-protecting insulating film of the second stage is formed.

A fifth embodiment of the present invention will next be described. The present embodiment is an embodiment of the method for manufacturing the semiconductor device according to the previously described second embodiment. The present embodiment differs from the previously described fourth embodiment in that the thickness reduction ratio is not necessarily set to 1 to 65% when the upper surface of the gate insulating film 4 is etched, and etching is performed so that the metal concentration of the upper surface of the gate insulating film 4 is $1.0 \times 10^{11}$ atoms/cm$^2$ or less. Aspects of the configuration other than those described above in reference to the present embodiment are the same as in the previously described first embodiment.

Specifically, a base layer 2, a semiconductor layer 3, a gate insulating film 4, and a gate electrode 5 are formed in this sequence on an insulating substrate 1 as shown in FIGS. 2A through 2D, an impurity is implanted into the semiconductor layer 3, and a source region 6, a drain region 7, and LDD regions 8 are formed as shown in FIG. 3A. These steps are the same as in the previously described fourth embodiment.

The substrate is then washed with functional water, after which the gate insulating film 4 is washed with a washing solution (buffered hydrofluoric acid, for example) capable of etching the gate insulating film 4, as shown in FIG. 3B. The upper surface of the portion other than the portion that corresponds to the area directly under the gate electrode 5 in the gate insulating film 4 is thereby etched to remove the metal, e.g., Al, Cr, Mo, W, Nb, Ta, or Nd, that is deposited on the gate insulating film 4. Etching is performed at this time so as to give a metal concentration of $1.0 \times 10^{11}$ atoms/cm$^2$ or less on the upper surface of the gate insulating film 4. The metal concentration in the interface between the gate insulating film 4 and the electrode-protecting insulating film 9 is thereby brought to $1.0 \times 10^{11}$ atoms/cm$^2$ or less when the electrode-protecting insulating film 9 is formed in a subsequent step. At this time, the ratio of etching-induced thickness reduction of the gate insulating film 4 is not necessarily limited to 1 to 65%. When the gate insulating film 4 is washed with a washing solution capable of etching the gate insulating film 4, the substrate may be immersed in a tank that contains the washing solution, but the use of a spin washing method in which the washing solution is dripped onto the gate insulating film 4 while the substrate is rotated is preferred in order to evenly treat the entire surface of the substrate.

Subsequent steps are the same as in the previously described fourth embodiment. Specifically, the electrode-protecting insulating film 9 is formed on the gate insulating film 4 and gate electrode 5 as shown in FIG. 3C, hydrogen plasma treatment and impurity-activating heat treatment are performed as shown in FIGS. 4A and 4B, and the upper surface of the electrode-protecting insulating film 9 is washed with functional water as shown in FIG. 5A, after which the electrode-protecting insulating film 9 is washed with a washing solution capable of etching the electrode-protecting insulating film 9, the carrier traps are removed from the electrode-protecting insulating film 9, and contact holes 10 and an electrode film 11 are formed as shown in FIG. 5B and FIG. 1. The semiconductor device according to the previously described second embodiment is thereby manufactured.

The reasons for the numerical limits in the conditions according to which the present invention is structured will next be described. Specifically, the reason for setting the metal concentration in the interface between the gate insulating film 4 and the electrode-protecting insulating film 9 to $1.0 \times 10^{11}$ atoms/cm$^2$ or less will be described. Table 1 shows the amount of change in the threshold voltage when a bias stress is applied for 10 hours to three types of TFT having different Al concentrations in the interface between the gate insulating film 4 and the electrode-protecting insulating film 9. Each TFT is a P-channel-type TFT having a channel width of 4 μm, a channel length of 4 μm, and an LDD region width of 1.2 μm. The drain/source voltage (Vds) was 0 V, and the gate/source voltage (Vgs) was +11 V.

TABLE 1

|  | TFT-A | TFT-B | TFT-C |
| --- | --- | --- | --- |
| Al Concentration | $2.3 \times 10^{11}$ | $1.0 \times 10^{11}$ | $2.8 \times 10^{10}$ |
| Amount of Change (V) in | 4.9 | 0.10 | 0.08 |

The amount of change in the threshold voltage increases with increased metal concentration in the interface between the gate insulating film 4 and the electrode-protecting insulating film 9. As shown in Table 1, the Al concentration in the interface between the gate insulating film 4 and the electrode-protecting insulating film 9 in TFT-A is $2.3 \times 10^{12}$ atoms/cm$^2$, and the amount of change in the threshold voltage is large, being 4.9 V. In contrast, the Al concentration in TFT-B and TFT-C is $1.0 \times 10^{11}$ atoms/cm$^2$ or less, and the amount of change in the threshold voltage is small, being 0.10 V. The same trend is observed for metals other than Al. It is therefore preferred that the metal concentration in the interface between the gate insulating film and the electrode-protecting insulating film be $1.0 \times 10^{11}$ atoms/cm$^2$ or less.

The operation of the present embodiment will next be described. In the present embodiment, a conducting film is formed by sputtering or CVD in the step of FIG. 2D for forming the gate electrode 5, and this conducting film is patterned by etching. At this time, the metal constituting the inner wall of the chamber in which sputtering, CVD, or etching is performed, such as Al, Cr, Mo, W, Ng, Ta, or Nd, is deposited on the gate insulating film 4. As a result, this metal also remains in the interface between the gate insulating film 4 and the electrode-protecting insulating film 9, and acts as a carrier trap when the TFT is operated.

Therefore, after the gate electrode 5 is formed in the present embodiment in the step shown in FIG. 2D, the upper surface of the gate insulating film 4 is washed and etched with a washing solution capable of etching the gate insulating film 4 and the step shown in FIG. 3B, and the metal deposited on the gate insulating film 4 is removed. Washing is performed at this time until the metal concentration in the interface between the gate insulating film 4 and the electrode-protecting insulating film 9 becomes $1.0 \times 10^{11}$ atoms/cm$^2$ or less. The carrier traps are thereby removed from the aforementioned interface, and the operation of the TFT is stabilized. Operations and effects other than those described above in reference to the present embodiment are the same as in the previously described fourth embodiment.

A sixth embodiment of the present invention will next be described. The present embodiment is an embodiment of the method for manufacturing the semiconductor device according to the previously described third embodiment. The present embodiment differs from the previously described fourth embodiment in that the thickness reduction ratio during etching of the upper surface of the gate insulating film 4 is not necessarily set to 1 to 65%, and etching is performed so that the ratio (Dtr/$C_{LDD}$) has a value of 0.4 or less, where Dtr is the surface density of carrier traps in the portions that correspond to the areas directly above the LDD regions 8 of the gate insulating film 4, and $C_{LDD}$ is the volumetric concentration of the impurity in the LDD regions 8. Aspects of the configuration other than those described above in reference to the present embodiment are the same as in the previously described fourth embodiment.

Specifically, as shown in FIGS. 2A, 2D, and 3A, the base layer 2, the semiconductor layer 3, the gate insulating film 4, and the gate electrode 5 are formed in this sequence on the insulating substrate 1 by the same step as in the previously described fourth embodiment, an impurity is implanted into the semiconductor layer 3, and the source region 6, the drain region 7, and the LDD regions 8 are formed.

The substrate is then washed with functional water, after which the gate insulating film 4 is washed with a washing solution (buffered hydrofluoric acid, for example) capable of etching the gate insulating film 4, as shown in FIG. 3B. As a result, the upper surface of the portion other than the portion that corresponds to the area directly under the gate electrode 5 in the gate insulating film 4 is etched, and the carrier traps are removed. Washing at this time is performed so that the ratio (Dtr/$C_{LDD}$) has a value of 0.4 or less, where Dtr is the surface density of carrier traps in the portions that correspond to the areas directly above the LDD regions 8 of the gate insulating film 4, and $C_{LDD}$ is the volumetric concentration of the impurity in the LDD regions 8. The ratio of the etching-induced thickness reduction of the gate insulating film 4 is not necessarily limited to 1 to 65%. The value of the ratio (Dtr/$C_{LDD}$) is controlled by adjusting the amount of etching with respect to the gate insulating film 4, or by adjusting the quantity of the impurity implanted into the LDD regions. When the gate insulating film 4 is washed with a washing solution capable of etching the gate insulating film 4, the substrate may be immersed in a tank that contains the washing solution, but the use of a spin washing method in which the washing solution is dripped onto the gate insulating film 4 while the substrate is rotated is preferred in order to evenly treat the entire surface of the substrate.

Subsequent steps are the same as in the previously described fourth embodiment. Specifically, as shown in FIGS. 3C through 5B and FIG. 1, the electrode-protecting insulating film 9 is formed on the gate insulating film 4 and gate electrode 5, impurity-activating heat treatment and hydrogen plasma treatment are performed, and the upper surface of the electrode-protecting insulating film 9 is washed with functional water, after which the electrode-protecting insulating film 9 is washed with a washing solution capable of etching the electrode-protecting insulating film 9, the carrier traps are removed from the electrode-protecting insulating film 9, and contact holes 10 and an electrode film 11 are formed. The semiconductor device according to the previously described third embodiment is thereby manufactured.

The reasons for the numerical limits in the conditions according to which the present invention is structured will next be described. Specifically, the reason will be described for setting the value of the ratio (Dtr/$C_{LDD}$) to 0.4 or less, where Dtr is the surface density of carrier traps in the portions that correspond to the areas directly above the LDD regions 8 of the gate insulating film 4, and $C_{LDD}$ is the volumetric concentration of the impurity in the LDD regions 8. Table 2 shows the value of the aforementioned ratio (Dtr/$C_{LDD}$) for three types of TFT having different volumetric concentrations of the impurity in the LDD regions 8, and the rate of change in the threshold voltage when a bias stress is applied for 50 hours to these TFT. As previously mentioned, the value of the ratio (Dtr/$C_{LDD}$) is a value in which the trap surface density of carriers present in the portions directly above the LDD regions in the gate insulating film is normalized according to the volumetric concentration of the impurity in the LDD regions.

TABLE 2

|  | TFT-D | TFT-E | TFT-F |
| --- | --- | --- | --- |
| Ratio (Dtr/$C_{LDD}$) | 0.30 | 0.40 | 0.65 |
| Rate of Change (%) in Threshold | 1 | 5 | 22 |

The rate of change of the threshold voltage increases with increased value of the ratio (Dtr/$C_{LDD}$). As shown in Table 2, the value of the ratio (Dtr/$C_{LDD}$) is 0.4 or less, and the rate of change of the threshold voltage is 5% or less for TFT-D and TFT-E. In contrast, for TFT-F, the value of the ratio (Dtr/$C_{LDD}$) is 0.65, and the rate of change of the threshold voltage is 22%. In practice, the rate of change of the threshold voltage is preferably kept to 5% or less. Therefore, the value of the ratio (Dtr/$C_{LDD}$) is preferably 0.4 or less.

As described above, when carrier traps are present in the gate insulating film, carriers are trapped in these carrier traps when the TFT is in a biased state. The electric field formed by these trapped carriers draws the carriers in the semiconductor layer towards the surface layer portion adjacent to the gate insulating film in the semiconductor layer. The field-weakening effect of the LDD regions is therefore affected not only by the impurity concentration of the LDD regions, but also by the concentration of the carriers that are thus drawn in, and the characteristics of the TFT fluctuate.

Therefore, the effect of the carriers trapped in the carrier traps on the field-weakening effects of the LDD regions can be suppressed according to the present embodiment by setting the abovementioned ratio (Dtr/$C_{LDD}$) to 0.4 or less. As a result, it is possible to form a TFT that exhibits little change over time when in a biased state, i.e., it is possible to form a highly reliable TFT.

Since the ratio of the carrier trap surface density with respect to the carrier concentration of the LDD regions is set to 0.4 or less in the present embodiment, the number of carriers trapped when a bias stress is applied to the TFT is small, and the characteristics of the TFT can be prevented from changing over time due to a bias stress. A highly reliable semiconductor device can thereby be obtained. Operations and effects other than those described above in reference to the present embodiment are the same as in the previously described fourth embodiment.

More specific embodiments of the present invention will be described hereinafter. First, a seventh embodiment of the present invention will be described. The present embodiment more specifically describes the aforementioned fourth embodiment. A glass substrate is first prepared as the insulating substrate 1, as shown in FIG. 2A. A single-layer silicon oxide film having a thickness of 300 nm as a base layer 2 on this glass substrate by plasma CVD. An amorphous silicon layer 3a having a thickness of 50 nm is then formed by low-pressure CVD, as shown in FIG. 2B. Using an XeCl excimer laser annealing device, the amorphous silicon layer 3a is then irradiated by a XeCl excimer laser and crystallized, and a crystallized silicon layer is formed.

A resist pattern is then formed on this crystallized silicon layer, dry etching is performed using this resist pattern as a mask, and the crystallized silicon layer is patterned into an island shape, as shown in FIG. 2C. The semiconductor layer 3 is thereby formed. The resist pattern is then removed.

After a silicon oxide film having a thickness of 100 nm as a gate insulating film 4 on the base layer 2 using a plasma CVD device, a trace quantity of phosphorus is added using the same device without exposing the product to the atmosphere, and a microcrystalline silicon film having a thickness of 100 nm is continuously formed. A Cr layer having a thickness of 200 nm is then formed by sputtering. A resist pattern (not shown in the drawing) is then formed, dry etching is performed using this resist pattern as a mask, the Cr layer and the microcrystalline silicon layer are patterned, and a gate electrode 5 composed of the microcrystalline silicon layer and the Cr layer is formed, as shown in FIG. 2D.

A resist pattern that has open regions where the source region 6 and the drain region 7 are to be formed in the semiconductor layer 3 is then formed on the gate insulating film 4 and gate electrode 5, as shown in FIG. 3A. Using an ion implantation device, boron ions are implanted using this resist pattern as a mask, and the source region 6 and drain region 7 are formed in the semiconductor layer 3. At this time, the implanted quantity of boron ions is set to $3\times10^{15}$ atoms/cm$^2$, and the acceleration energy is set to 80 keV. Oxygen plasma ashing and immersion in a resist peeling solution are then performed, and the resist pattern is peeled off. Using the gate electrode 5 as a mask, boron is then implanted into the semiconductor layer 3 at a lower concentration than the concentration used to form the source region 6 and the drain region 7, and LDD regions 8 are formed. At this time, the implanted quantity of boron ions is set to $3\times10^{13}$ atoms/cm$^2$, and the acceleration energy is set to 30 kV.

Hydrogenated water is then dripped onto the substrate while the substrate is rotated, and the substrate is washed as shown in FIG. 3B. Ozonated water is then dripped onto the substrate, and the substrate is washed. Debris is thereby removed. Continuing the process, dilute hydrofluoric acid having a concentration of 0.5% is dripped onto the substrate, the portion protruding from the area directly under the gate electrode 5 in the gate insulating film 4 is washed, and etching is performed. At this time, washing is performed for a controlled period of time so as to give a 2% thickness reduction ratio of the gate insulating film 4.

A silicon oxide film having a thickness of 400 nm as an electrode-protecting insulating film 9 is formed on the gate insulating film 4 and the gate electrode 5 using a plasma CVD device, as shown in FIG. 3C. As shown in FIG. 4A, the substrate is then placed in an annealing oven filled with nitrogen gas, a heat treatment is performed for four hours at a temperature of 500° C., and the impurity implanted into the semiconductor layer 3 is activated. As shown in FIG. 4B, the substrate is then placed in a vacuum chamber, hydrogen gas is introduced into the vacuum chamber, and a high-frequency electric field having a frequency of 13.56 MHz is applied to excite and convert the hydrogen gas to plasma. A hydrogen plasma treatment is thereby performed on the substrate for one hour. The treatment temperature at this time is 350° C. The semiconductor layer 3 is thus terminated.

Hydrogenated water is then dripped onto the substrate while the substrate is rotated, and washing is performed as shown in FIG. 5A. Ozonated water is then dripped onto the substrate, and the substrate is washed. Debris is thereby removed from the surface of the silicon oxide film. Continuing the process, dilute hydrofluoric acid having a concentration of 0.5% is dripped onto the substrate, and the substrate is washed. The entire upper surface of the silicon oxide film is thereby etched, and the carrier traps introduced by the hydrogen plasma treatment and impurity-activating heat treatment are thereby removed.

A silicon oxide film (not shown in the drawing) having a thickness of 500 nm is then formed by plasma CVD. As shown in FIG. 5B, a resist pattern is then formed on the silicon oxide film; dry etching is performed using this resist pattern as a mask; wet etching using dilute hydrofluoric acid at a concentration of 0.5% is then performed using the same resist pattern as a mask; the area directly above the source region 6 and the area directly above the drain region 7 in the silicon oxide film, the electrode-protecting insulating film 9, and the gate insulating film 4, and the area directly above the gate electrode 5 in the silicon oxide film and electrode-protecting insulating film 9 are selectively removed; and contact holes 10 are formed.

An AlSi layer is then formed by sputtering as shown in FIG. 1. A resist pattern is then formed on this AlSi layer, dry etching is performed using this resist pattern as a mask, and the AlSi layer is patterned in the desired shape. The electrode film 11 is thereby formed. The resist pattern is then peeled off A P-channel-type TFT can thereby be manufactured.

According to the present embodiment, it is possible to manufacture a highly reliable TFT in which there is little change over time even in a state in which a bias stress is applied. Operations and effects other than those described above in reference to the present embodiment are the same as in the previously described fourth embodiment.

An eighth embodiment of the present invention will next be described. The present embodiment more specifically describes the aforementioned fifth embodiment. A glass substrate is first prepared as the insulating substrate 1, as shown in FIG. 2A. As shown in FIGS. 2A and 2B, a silicon oxide film having a thickness of 300 nm as a base layer 2 and an amorphous silicon layer 3a having a thickness of 50 nm are then continuously formed on this glass substrate by plasma CVD without exposing the product to the atmosphere during the process. The amorphous silicon layer 3a is then irradiated by a XeCl excimer laser and crystallized, and a crystallized silicon layer is formed.

The steps shown in FIGS. 2C through 3A are then performed. The conditions used in these steps are the same as in the previously described seventh embodiment.

Hydrogenated water is then dripped onto the substrate while the substrate is rotated, and the substrate is washed as shown in FIG. 3B. Ozonated water is then dripped onto the substrate, and the substrate is washed. Debris is thereby removed. Continuing the process, dilute hydrofluoric acid having a concentration of 1.0% is dripped onto the substrate, and the portion protruding from the area directly under the gate electrode 5 in the gate insulating film 4 is washed and etched. At this time, the concentration of metal in the exposed surface (upper surface) of the gate insulating film 4 decreases as the washing progresses. The washing is performed in the present embodiment until the metal concentration reaches $2.8\times10^{10}$ atoms/cm$^2$.

As shown in FIG. 3C, a silicon oxide film having a thickness of 100 nm as an electrode-protecting insulating film 9 on the gate insulating film 4 and the gate electrode 5 using a plasma CVD device. An impurity-activating heat treatment is then performed as shown in FIG. 4A, and a hydrogen plasma treatment is performed as shown in FIG. 4B. The conditions used in these treatments are the same as in the previously described seventh embodiment.

Hydrogenated water is then dripped onto the substrate while the substrate is rotated, and the substrate is washed as shown in FIG. 5A. Ozonated water is then dripped onto the substrate, and the substrate is washed. Debris is thereby removed from the surface of the silicon oxide film. Dilute hydrofluoric acid having a concentration of 1.0% is then dripped onto the substrate, and the substrate is washed. The upper surface of the silicon oxide film is thereby etched, and the carrier traps introduced by the hydrogen plasma treatment and impurity-activating heat treatment are thereby removed.

A silicon oxide film having a thickness of 500 nm is then formed by plasma CVD. As shown in FIG. 5B, a resist pattern is then formed on the silicon oxide film, dry etching is performed using this resist pattern as a mask, wet etching using dilute hydrofluoric acid at a concentration of 1.0% is then performed using the same resist pattern as a mask, and contact holes 10 are formed. Subsequent steps are the same as in the previously described seventh embodiment. The operation and effects of the present embodiment are the same as in the previously described fifth embodiment.

A ninth embodiment of the present invention will next be described. The present embodiment more specifically describes the aforementioned sixth embodiment. First, the steps shown in FIGS. 2A through 2D and FIG. 3A are performed. The conditions used in these steps are the same as in the previously described seventh embodiment.

Hydrogenated water is then dripped onto the substrate while the substrate is rotated, and the substrate is washed as shown in FIG. 3B. Ozonated water is then dripped onto the substrate, and the substrate is washed. Debris is thereby removed. Dilute hydrofluoric acid having a concentration of 1.5% is then dripped onto the substrate, and the portion protruding from the area directly under the gate electrode 5 in the gate insulating film 4 is washed and etched. At this time, the value of the ratio (Dtr/$C_{LDD}$) decreases as the washing progresses, where Dtr is the trap surface density of the portions that correspond to the areas directly above the LDD regions 8 in the gate insulating film 4, and $C_{LDD}$ is the volumetric concentration of the impurity in the LDD regions 8. Washing is performed in the present embodiment until the ratio (Dtr/$C_{LDD}$) reaches approximately 0.3.

As shown in FIG. 3C, a silicon oxide film having a thickness of 100 nm as an electrode-protecting insulating film 9 on the gate insulating film 4 and the gate electrode 5 using a plasma CVD device. An impurity-activating heat treatment is then performed as shown in FIG. 4A, and a hydrogen plasma treatment is performed as shown in FIG. 4B. The conditions used in these treatments are the same as in the previously described seventh embodiment.

Hydrogenated water is then dripped onto the substrate while the substrate is rotated, and the substrate is washed as shown in FIG. 5A. Ozonated water is then dripped onto the substrate, and the substrate is washed. Debris is thereby removed from the surface of the silicon oxide film. Dilute hydrofluoric acid having a concentration of 1.5% is then dripped onto the substrate, and the substrate is washed. The upper surface of the silicon oxide film is thereby etched, and the carrier traps introduced by the hydrogen plasma treatment and impurity-activating heat treatment are thereby removed.

A silicon oxide film having a thickness of 500 nm is then formed by plasma CVD. As shown in FIG. 5B, a resist pattern is then formed on the silicon oxide film, dry etching is performed using this resist pattern as a mask, wet etching using dilute hydrofluoric acid at a concentration of 2.0% is then performed using the same resist pattern as a mask, and contact holes 10 are formed. Subsequent steps are the same as in the previously described seventh embodiment. The operation and effects of the present embodiment are the same as in the previously described sixth embodiment.

What is claimed is:

1. A method for manufacturing a semiconductor device, comprising:
   forming a semiconductor layer in localized fashion on a substrate;
   forming a gate insulating film on the semiconductor layer;
   forming a gate electrode in a portion of the area 25 directly above said semiconductor layer on the gate insulating film;
   forming an electrode-protecting insulating film on said gate insulating film and said gate electrode; terminating said semiconductor layer; and
   washing said electrode-protecting insulating film with a washing solution capable of etching the electrode-protecting insulating film to etch away the surface layer portion of the electrode-protecting insulating film.

2. The method for manufacturing a semiconductor device according to claim 1, wherein said step for etching away the surface layer portion of the electrode-protecting insulating film comprises dripping a washing solution capable of etching said electrode-protecting insulating film onto said electrode-protecting insulating film while said substrate is rotated.

3. The method for manufacturing a semiconductor device according to claim 1, wherein an aqueous solution containing hydrogen fluoride is used as the washing solution capable of etching said electrode-protecting insulating film.

4. The method for manufacturing a semiconductor device according to claim 1, comprising a step for washing said electrode-protecting insulating film with functional water prior to said step for washing the electrode-protecting insulating film with a washing solution capable of etching the electrode-protecting insulating film.

5. The method for manufacturing a semiconductor device according to claim 4, wherein hydrogenated water, ozonated water, or carbonated water is used as said functional water.

6. The method for manufacturing a semiconductor device according to claim 4, comprising a step for radiating ultraviolet rays to said electrode-protecting insulating film prior to said step for washing the electrode-protecting insulating film with functional water.

7. The method for manufacturing a semiconductor device according to claim 1, comprising a step for implanting an impurity into said semiconductor layer and a step for washing said gate insulating film with a washing solution capable of etching the gate insulating film, subsequent to the step for forming said gate electrode.

8. The method for manufacturing a semiconductor device according to claim 7, wherein a washing is performed until the value of the ratio (B/A) has a value of from 0.01 to 0.65 in said washing step, where A is the film thickness of the portion positioned in the area directly under said gate electrode in said gate insulating film, and B is the difference between the film thickness of the portion positioned in the area directly under the gate electrode and the film thickness of the portion other than said area directly under the gate electrode.

9. The method for manufacturing a semiconductor device according to claim 7, wherein washing is performed in said washing step until the concentration of metal on the surface of said gate insulating film is $1 \times 10^{11}$ atoms/cm$^2$ or less.

10. The method for manufacturing a semiconductor device according to claim 9, wherein said metal is one or more types of metal selected from the group consisting of Al, Cr, Mo, W, Nb, Ta, and Nd.

11. The method for manufacturing a semiconductor device according to claim 7, wherein the step for implanting an impurity into said semiconductor layer involves forming a source region, a drain region, and an LDD region in said semiconductor layer; and washing is performed in said washing step until the ratio (Dtr/$C_{LDD}$) has a value of 0.4 or less, where Dtr is the surface density of carrier traps in the area directly above said LDD region of said gate insulating film, and $C_{LDD}$ is the volumetric concentration of carriers in said LDD region.

12. A method for manufacturing a semiconductor device, comprising:
   forming a semiconductor layer in localized fashion on a substrate;
   forming a gate insulating film on the semiconductor layer;
   forming a gate electrode in a portion of the area directly above said semiconductor layer on the gate insulating film;
   implanting an impurity into said semiconductor layer;
   washing said gate insulating film with a washing solution capable of etching the gate insulating film; and
   forming an electrode-protecting insulating film on said gate insulating film and said gate electrode; wherein washing is performed in said washing step until the concentration of metal on the surface of said gate insulating film is $1 \times 10^{11}$ atoms/cm$^2$ or less.

13. A method for manufacturing a semiconductor device, comprising:
   forming a semiconductor layer in localized fashion on a substrate;
   forming a gate insulating film on the semiconductor layer;
   forming a gate electrode in a portion of the area directly above said semiconductor layer on the gate insulating film;

implanting an impurity into said semiconductor layer to form a source region, a drain region, and an LDD region in said semiconductor layer and washing said gate insulating film with a washing solution capable of etching the gate insulating film; wherein washing is performed in said washing step until the ratio ($Dtr/C_{LDD}$) has a value of 0.4 or less, where Dtr is the surface density of carrier traps in the area directly above said LDD region of said gate insulating film, and $C_{LDD}$ is the volumetric concentration of carriers in said LDD region.

14. The method for manufacturing a semiconductor device according to claim 7, wherein said step for washing the gate insulating film has a step for dripping a washing solution capable of etching said gate insulating film onto said gate insulating firm where said substrate is rotated.

15. The method for manufacturing a semiconductor device according to claim 12, wherein said step for washing the gate insulating film has a step for dripping a washing solution capable of etching said gate insulating film onto said gate insulating film where said substrate is rotated.

16. The method for manufacturing a semiconductor device according to claim 13, wherein said step for washing the gate insulating film has a step for dripping a washing solution capable of etching said gate insulating film onto said gate insulating film where said substrate is rotated.

17. The method for manufacturing a semiconductor device according to claim 7, wherein an aqueous solution containing hydrogen fluoride is used as the washing solution capable of etching said gate insulating film.

18. The method for manufacturing a semiconductor device according to claim 12, wherein an aqueous solution containing hydrogen fluoride is used as the washing solution capable of etching said gate insulating film.

19. The method for manufacturing a semiconductor device according to claim 13, wherein an aqueous solution containing hydrogen fluoride is used as the washing solution capable of etching said gate insulating film.

20. The method for manufacturing a semiconductor device according to claim 7, comprising a step for washing said gate insulating film with functional water prior to said step for washing the gate insulating film with a washing solution capable of etching the gate insulating film.

21. The method for manufacturing a semiconductor device according to claim 12, comprising a step for washing said gate insulating film with functional water prior to said step for washing the gate insulating film with a washing solution capable of etching the gate insulating film.

22. The method for manufacturing a semiconductor device according to claim 13, comprising a step for washing said gate insulating film with functional water prior to said step for washing the gate insulating film with a washing solution capable of etching the gate insulating film.

23. The method for manufacturing a semiconductor device according to claim 20, wherein hydrogenated water, ozonated water, or carbonated water is used as said functional water.

24. The method for manufacturing a semiconductor device according to claim 21, wherein hydrogenated water, ozonated water, or carbonated water is used as said functional water.

25. The method for manufacturing a semiconductor device according to claim 22, wherein hydrogenated water, ozonated water, or carbonated water is used as said functional water.

26. The method for manufacturing a semiconductor device according to claim 20, comprising a step for radiating ultraviolet rays to said gate insulating film prior to said step for washing the gate insulating film with functional water.

27. The method for manufacturing a semiconductor device according to claim 21, comprising a step for radiating ultraviolet rays to said gate insulating film prior to said step for washing the gate insulating film with functional water.

28. The method for manufacturing a semiconductor device according to claim 22, comprising a step for radiating ultraviolet rays to said gate insulating film prior to said step for washing the gate insulating film with functional water.

* * * * *